(12) United States Patent
Fischer et al.

(10) Patent No.: US 10,274,541 B2
(45) Date of Patent: Apr. 30, 2019

(54) SYSTEM AND METHOD FOR INSPECTION OF A GENERATOR STATOR CORE STEP IRON REGION WITH THE ROTOR IN-SITU

(71) Applicant: Siemens Energy, Inc., Orlando, FL (US)

(72) Inventors: Mark W. Fischer, Pittsburgh, PA (US); James A. Bauer, Gibsonia, PA (US); Lukas Demsey, Pittsburgh, PA (US)

(73) Assignee: SIEMENS ENERGY, INC., Orlando, FL (US)

( * ) Notice: Subject to any disclaimer, the term of this patent is extended or adjusted under 35 U.S.C. 154(b) by 228 days.

(21) Appl. No.: 15/525,176

(22) PCT Filed: Nov. 19, 2015

(86) PCT No.: PCT/US2015/061526
§ 371 (c)(1),
(2) Date: May 8, 2017

(87) PCT Pub. No.: WO2016/081702
PCT Pub. Date: May 26, 2016

(65) Prior Publication Data
US 2017/0363688 A1    Dec. 21, 2017

Related U.S. Application Data

(60) Provisional application No. 62/082,670, filed on Nov. 21, 2014.

(51) Int. Cl.
*H02K 1/16*    (2006.01)
*G01R 31/34*    (2006.01)
*G01R 31/12*    (2006.01)

(52) U.S. Cl.
CPC ......... *G01R 31/34* (2013.01); *G01R 31/1263* (2013.01)

(58) Field of Classification Search
CPC ........ H02K 2213/03; H02K 1/16; H02K 1/32; H02K 3/12; H02K 9/19
See application file for complete search history.

(56) References Cited

U.S. PATENT DOCUMENTS 3,040,998 A * 6/1962 Rogers ................. H02K 15/085
   242/432.4
4,803,563 A * 2/1989 Dailey ................. G01N 27/902
   324/220

(Continued)

OTHER PUBLICATIONS

PCT International Search Report and Written Opinion dated Mar. 28, 2016 corresponding to PCT Application No. PCT/US2015/061526 filed Nov. 19, 2015.

*Primary Examiner* — Alesa Allgood (57) ABSTRACT

Eddy current inspection of the step iron region of a generator stator core lamina insulation is performed while the rotor is in situ, with inspection system (81). The system (81) excites the stator core (26) and then measures any eddy currents indicative of a damaged region. The inspection system carriage (42) and its pivoting extension arm (52) are inserted within the rotor gap (34) while the rotor (22) remains in situ within the generator (20). The EL CID system's eddy current sensing coil assembly (54) includes a Chattock coil (70), which is mounted in a coil housing (56, 58) that is in turn pivotally mounted on a distal end of the extension arm (52). A sensing surface (60) of the coil housing (56, 58) remains in abutting contact with the generator core circumference in the step iron region (32), despite the step-like profile of the core circumference in that region.

20 Claims, 5 Drawing Sheets

(56) References Cited

U.S. PATENT DOCUMENTS

| | | | | |
|---|---|---|---|---|
| 4,889,000 | A | * 12/1989 | Jaafar | G01R 31/34 |
| | | | | 73/865.8 |
| 4,970,890 | A | * 11/1990 | Jaafar | G01R 31/34 |
| | | | | 73/12.09 |
| 5,105,658 | A | * 4/1992 | Jaafar | G01R 31/34 |
| | | | | 73/865.8 |
| 5,341,095 | A | * 8/1994 | Shelton | G01R 31/34 |
| | | | | 324/545 |
| 6,791,351 | B2 | * 9/2004 | Fischer | G01R 31/343 |
| | | | | 324/765.01 |
| 7,520,189 | B2 | * 4/2009 | Abbasi | H02K 15/00 |
| | | | | 324/220 |
| 2004/0000923 | A1 | * 1/2004 | Fischer | G01R 31/343 |
| | | | | 324/765.01 |
| 2004/0100270 | A1 | 5/2004 | Fischer et al. | |
| 2005/0005700 | A1 | * 1/2005 | Abbasi | G01N 29/223 |
| | | | | 73/620 |
| 2008/0098832 | A1 | * 5/2008 | Abbasi | H02K 15/00 |
| | | | | 73/865.9 |
| 2013/0234752 | A1 | * 9/2013 | Jaszcar | H02K 15/00 |
| | | | | 324/765.01 |

\* cited by examiner

SYSTEM AND METHOD FOR INSPECTION OF A GENERATOR STATOR CORE STEP IRON REGION WITH THE ROTOR IN-SITU

PRIORITY CLAIM AND INCORPORATION BY REFERENCE

This application claims the benefit of priority of U.S. Provisional Application No. 62/082,670, filed Nov. 21, 2014, and entitled "DEVICE AND METHOD OF INSPECTION OF THE GENERATOR STATOR CORE STEP IRON REGION WITH THE ROTOR IN-SITU", which is incorporated by reference herein.

This application incorporates by reference in its entirety U.S. Pat. No. 8,823,412, issued Sep. 2, 2014, and entitled "DEVICE AND METHOD FOR INSPECTION OF A STATOR CORE OF AN ELECTRICAL MACHINE" as if fully set forth herein.

TECHNICAL FIELD

The invention relates to generator stator core lamina insulation inspection. More particularly, the invention relates to methods and systems for inspection of step iron region stator core lamina insulation that is performed while the rotor is in situ, with an Electro-magnetic Core Imperfection Detector ("EL CID"). An EL CID detects potential hot spots electromagnetically by exciting the stator core and then measuring any resulting fault or eddy currents flowing through a damaged region. The inspection system is inserted within the rotor gap while the rotor remains in situ within the generator. The EL CID system's eddy current sensing Chattock coil is mounted on a pivoting extension arm, and remains in abutting contact with the generator core circumference in the step iron region, despite the step-like profile of the core circumference in that region.

BACKGROUND

Figure 1:
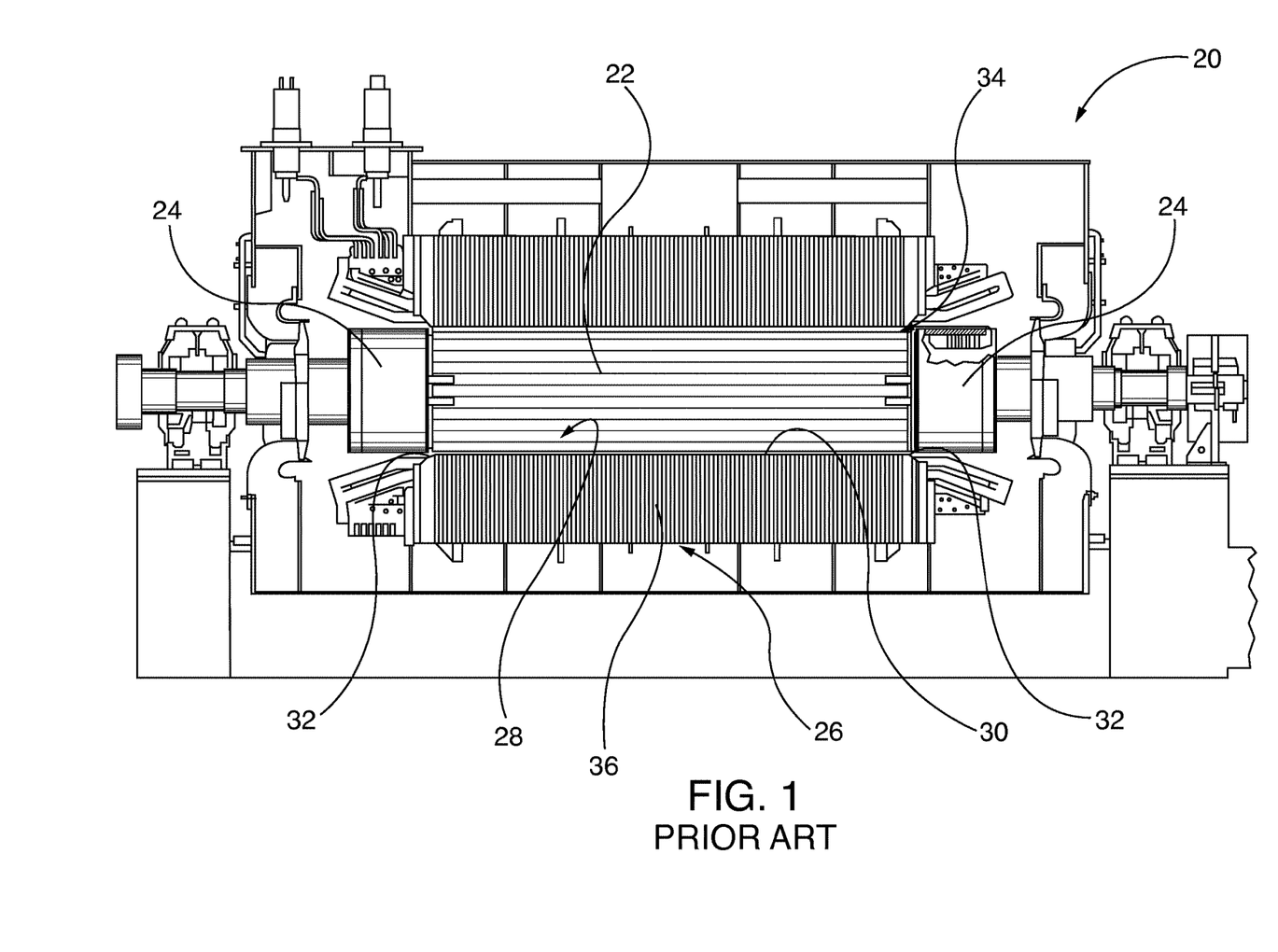
FIG. 1 is a cross sectional elevational view of an exemplary known, prior art generator, including the stator core step iron region, an in-situ rotor, a rotor retaining ring, and the rotor gap that is defined between the stator core and rotor.

FIG. 1 is illustrative of an exemplary known generator 20, which includes a rotatable rotor 22. The respective axial ends of the rotor are circumscribed by rotor retaining rings 24. The generator 20 includes a stator core 26, which defines a cylindrical bore 28, circumscribing the rotor 22. The core bore 28 has a generally constant diameter portion 30, except at its axial ends, where the diameter increases along the axis towards each respective end. The increase in bore diameter is stepped, so the portion adjacent to each axial end of the stator core is referred to as "step iron" 32. The step iron portion 32 facilitates in reducing the magnetic flux densities at the ends of the stator core 26. The rotor 22 and stator core 26 are radially separated by a rotor gap 34, which is accessible from an axial end of the generator 20 in the annular volume between the step iron 32 and the rotor retaining ring 24.

As described in U.S. Pat. No. 8,823,412, which is fully incorporated by reference herein, the stator cores 26 of electrical generators 20 and other electrical machines are made up of a stack of several, for example, thousands of individual steel sheets or laminations 36. The thickness of an individual sheet 36 is typically measured in thousandths of an inch. Each of the laminations 36 is coated with a thin layer of electrical insulation to insulate it electrically from its neighbors. This insulation prevents the alternating magnetic flux in the stator core 26 from inducing eddy currents between laminations 36. If the insulation between adjacent laminations 36 becomes damaged during assembly, operation, or maintenance, a conducting path may be formed through which currents are induced by the alternating flux. These conducting currents create "hot spots" which, if undetected, can result in damage to the machine.

One type of apparatus suitable for detecting such stator core hot spots is an Electro-magnetic Core Imperfection Detector ("EL CID"). An EL CID system detects potential hot spots electromagnetically by exciting the stator core 26 with an externally supplied current source and then measuring any resulting fault currents flowing through a damaged region. Typically, the EL CID system's sensors are held against the stator core laminations 36 inside the stator core bore 28, where the laminations 36 define the stator bore 28 circumference. The system sensors typically are then translated or transported along the axial length of the stator core 26, though other translation paths may be chosen. As the sensors scan axially along the length of the core, they produce an analog signal having a magnitude proportional to detected fault currents. By examining a plot of the magnitude of the analog signal versus the sensor distance along the length of the core, operators are able to detect the location of a damaged insulation.

During inspection using an EL CID system, the scanning operation at the main section of the stator core 26, (i.e., the cylindrical portion having constant diameter 30), may carried out by an automated tool, for example by using a belt driven carriage for the sensor riding on the inside diameter of the stator core 26 in an axial direction, as shown in U.S. Pat. No. 4,803,563. However, in the step iron portion 32 of the stator core 26 it is difficult to obtain accurate readings from the sensor due to the abrupt changes in contour axially over that region. The stepped changes in the region's contour make it difficult to move the sensor over that region by use of a carriage or manually, to avoid distorted outputs. A source of output distortion is the inability to maintain constant relative distance and alignment of the stator core bore 28 circumferential surface and the scanning sensor. It is more difficult to avoid distorted EL CID scanning sensor outputs when an automated tool of the above-mentioned type of U.S. Pat. No. 4,803,563 is used to move the sensor over the step iron portion 32, though the tool advantageously facilitates inspection of the constant diameter axial portions 30 of the stator core 26 while the generator rotor 22 remains in situ.

The EL CID system described in U.S. Pat. No. 8,823,412 inspects the stator core step iron region and any other part of the stator core bore. However, unlike the EL CID system shown in U.S. Pat. No. 4,803,563, it does not perform a stator lamina insulation inspection with an in-situ rotor.

SUMMARY OF INVENTION

Exemplary embodiments described herein are directed to inspection of generator stator core lamina insulation, particularly in the step iron region, while the generator rotor remains in situ, with an Electro-magnetic Core Imperfection Detector ("EL CID"). An EL CID detects potential insulation degradation hot spots electromagnetically by exciting the stator core and then measuring any resulting fault or eddy currents flowing through a damaged region. Detected eddy currents are indicative of insulation degradation. In accordance with exemplary embodiments, the inspection system carriage and its pivoting extension arm are inserted within the generator's rotor gap while the rotor remains in situ within the generator. A proximal end of the extension arm is pivotally coupled to the carriage. In some embodiments, the extension arm is pivotally coupled to an aft end of the carriage, and trailing the carriage translation direction within rotor gap during an inspection procedure. The EL CID system's eddy current sensing coil is mounted in a coil assembly, which includes housing for the sensing coil. The coil assembly housing is in turn pivotally mounted on a distal end of the extension arm. Due to the trailing arm proximal and distal end pivot joints, a sensing surface of the coil housing remains in parallel abutting contact with the generator core circumference in the step iron region, despite the step-like profile of the core circumference in that region, so that the signal sensed by the sensing coil is not influenced by relative sensing surface-core circumference alignment variances.

Exemplary embodiments of the invention feature an inspection apparatus for inspecting a step iron region of a generator stator core bore, while the rotor remains in situ therein. The step iron region is oriented proximate an axial end of the generator stator core, and the generator defines a rotor gap between the stator core bore and its opposed rotor along an axial dimension of the stator core bore. The inspection apparatus includes a translatable inspection carriage, having a bottom surface. An extension arm has a proximal end pivotally coupled to the inspection carriage by an extension arm pivot mount along a first pivot axis. The inspection apparatus also has an EL CID system eddy current sensing coil assembly, which in an exemplary embodiment comprises a Chattock coil that is retained in coil housing. The coil housing defines an elongated sensing surface. The sensing coil assembly also has a coil housing pivot mount that is pivotally coupled to a distal end of the extension arm along a second pivot axis that is parallel to the elongated sensing surface. In accordance with exemplary embodiments, when the inspection carriage is inserted within a generator rotor gap between a generator core bore, including a step iron region thereof, and an opposed rotor, the carriage bottom surface is in opposed orientation with the generator core, and the second pivot axis is oriented tangentially to radii defined by the stator core circumferential surface, including radii defined by the core's step iron region. As a result, the Chattock coil sensing surface remains parallel with and in abutting contact with the stator core circumferential surface defined by the core's step iron region, as the Chattock coil assembly is translated along the stator core's axial dimension by the inspection carriage.

In some exemplary embodiments, the extension arm first pivot axis is oriented parallel with the chassis bottom surface, while the second pivot axis is parallel with the first pivot axis. In such a two parallel pivot axis embodiment, when the inspection carriage is inserted within a generator rotor gap, the carriage bottom surface is in opposed orientation with the generator core, and the first and second pivot axes are oriented tangentially to radii defined by the stator core circumferential surface, including radii defined by the core's step iron region. The Chattock coil sensing surface remains parallel with and in abutting contact with the stator core circumferential surface defined by the core's step iron region, as the Chattock coil assembly is translated along the stator core's axial dimension by the inspection carriage during an EL CID inspection procedure.

Other exemplary embodiments of the invention feature an eddy current inspection system for inspecting lamina insulation within a step iron region of a generator stator core bore, while the rotor remains in situ within the generator. In this embodiment, an inspection crawler, for insertion within the previously described rotor gap between a generator core bore, including a step iron region thereof, and an opposed rotor, includes a translatable inspection carriage, having a bottom surface; and an extension arm. The extension arm has a proximal end pivotally coupled to the inspection carriage by an extension arm pivot mount along a first pivot axis. The inspection system carriage includes a sensing coil assembly, such as a Chattock coil assembly, having: a coil housing retaining a Chattock coil, an elongated sensing surface defined by the coil housing, and a coil housing pivot mount that is pivotally coupled to a distal end of the extension arm along a second pivot axis that is parallel to the elongated sensing surface. The EL CID inspection system also includes an eddy current excitation generator, for coupling to a generator stator core bore and generating an excitation current therein; and an eddy current inspection analyzer system, coupled to the Chattock coil, for correlating changes in coil output signal with variations in lamina insulation properties. The inspection carriage is inserted within a generator rotor gap, with the carriage bottom surface in opposed orientation with the generator core. Thereupon the second pivot axis is oriented tangentially to radii defined by the stator core circumferential surface, including radii defined by the core's step iron region, so that the Chattock coil sensing surface remains parallel with and in abutting contact with the stator core circumferential surface defined by the core's step iron region, as the Chattock coil assembly is translated along the step iron region's axial dimension by the inspection carriage. When the system's eddy current excitation generator is coupled to and generates excitation current within the generator core bore, the inspection carriage, with its Chattock coil sensing surface, is moved about the rotor gap. The eddy current inspection analyzer system monitors changes in the Chattock coil output that are in turn correlated with variations in lamina insulation properties within the step region.

Additional exemplary embodiments of the invention feature methods for inspecting lamina insulation within a step iron region of a generator stator core bore, while the rotor remains in situ therein. A provided generator has a rotor circumscribed by a stator core bore, and a step iron region oriented proximate an axial end of the generator stator core. The generator defines a rotor gap between the stator core bore and its opposed rotor along an axial dimension of the stator core. The provided, previously described EL CID eddy current inspection system includes an inspection crawler, having a translatable inspection carriage. The carriage includes a bottom surface, and an extension arm having a proximal end pivotally coupled to the inspection carriage by an extension arm pivot mount along a first pivot axis. The provided inspection system includes a Chattock coil assembly. The Chattock coil assembly includes a coil housing retaining a Chattock coil, an elongated sensing surface defined by the coil housing, and a coil housing pivot mount that is pivotally coupled to a distal end of the extension arm along a second pivot axis that is parallel to the elongated sensing surface. The inspection method uses an eddy current excitation generator, coupled to the generator stator core bore, which generates an excitation current in the bore. An eddy current inspection analyzer system is coupled to the Chattock coil, for correlating changes in coil output signal with variations in lamina insulation properties. When practicing this exemplary inspection method, the inspection carriage is inserted within the generator rotor gap so that the carriage bottom surface is in opposed orientation with the generator core circumferential surface. In some embodiments, the carriage inserted into the rotor gap with the extension arm trailing the carriage. The carriage is translated along the stator core axial dimension; so that the Chattock coil sensing surface is parallel with and in opposed abutting contact with the stator core circumferential surface defined by the core's step iron region. The eddy current excitation generator is coupled to a generator stator core bore, which in turn generates an excitation current therein, before or after the inspection carriage insertion. The eddy current inspection analyzer system is coupled to the Chattock coil, before or after inspection carriage insertion; for receiving an output signal therefrom and correlating the output signal with lamina insulation properties. As the Chattock coil sensing surface is translated along the step iron region by translating the carriage along the stator core, changes in the Chattock coil output signal are monitored with the eddy current inspection analyzer system. In some embodiments, the method further comprises translating the Chattock coil sensing surface inboard of the step iron region by translating the carriage along the stator core and monitoring changes in the Chattock coil output signal with the eddy current inspection analyzer. In this way, it is possible to inspect stator core lamina insulation axially across part, or the entire stator core, as is desired.

In some exemplary embodiments, the carriage has magnets, for magnetically attracting the carriage bottom to the generator core bore. In some exemplary embodiments, the carriage has a motorized drive system, for selectively translating the carriage along the generator core bore. In some exemplary embodiments, an encoder wheel is coupled to the carriage and generating an encoder output signal. The encoder output signal is then utilized, directly or indirectly, by the eddy current analyzer system, in order to correlate the encoder output signal with relative translation position of the carriage within the stator core bore. As the carriage is translated along the generator core bore, the eddy current analyzer system identifies localized variations in lamina insulation in the stator core step region and, if desired, in other stator core regions.

The respective features of the exemplary embodiments of the invention that are described herein may be applied jointly or severally in any combination or sub-combination.

BRIEF DESCRIPTION OF DRAWINGS

The exemplary embodiments of the invention are further described in the following detailed description in conjunction with the accompanying drawings, in which.

To facilitate understanding, identical reference numerals have been used, where possible, to designate identical elements that are common to the figures. The figures are not drawn to scale.

DESCRIPTION OF EMBODIMENTS

Exemplary embodiments of the invention are utilized for inspection of generator stator core lamina insulation, particularly in the step iron region, and as desired in the remaining portions of the stator core. The inspection is performed while the rotor is in situ. The exemplary embodiment's inspection systems utilize an Electro-magnetic Core Imperfection Detector ("EL CID") system, a portion of which is coupled to a carriage that is translated within the stator core, such as an automated crawler-type carriage. Generally, the EL CID system detects potential hot spots electromagnetically by exciting the stator core with an external current source, such as pulsed current source. Then the EL CID system measures any resulting fault or eddy currents flowing through a damaged region with a sensing coil. Variations in currents sensed by the sensing coil are associated with insulation faults. The inspection system carriage and its pivoting extension arm are inserted within the rotor gap while the rotor remains in situ within the generator. The EL CID system's eddy current sensing coil is mounted in a coil housing that is in turn pivotally mounted on a distal end of the extension arm. A sensing surface of the coil housing remains in abutting contact with the generator core circumference in the step iron region, despite the step-like profile of the core circumference in that region. Consistent alignment of the sensing surface and the generator core circumference eliminates alignment variances in the sensing coil measured current readings or data.

Specific embodiments described below provide a device and a method, particularly adapted for performing an EL CID test on the stator core of an electrical machine over the main section and on the step iron regions. The exemplary electrical machine is a generator. The existing manual as well as automated tools for EL CID testing pose difficulties in the correct manipulation of the electromagnetic sensor (also referred to herein as a "sensing coil"), especially over the step iron portion. If the sensing coil is not maneuvered correctly to maintain constant relative alignment, including distance, between itself and the stator core step iron circumferential surface profile, the output readings can be distorted in a way that might mask or otherwise hide readings that would otherwise be attributed to damaged insulation. The embodiments described below overcome those difficulties by providing an automated tool capable of accurately monitoring the step iron portion of the stator, as well as the straight main section of the stator, while being insertable within the rotor gap between an in situ rotor and the stator core.

Figure 2:
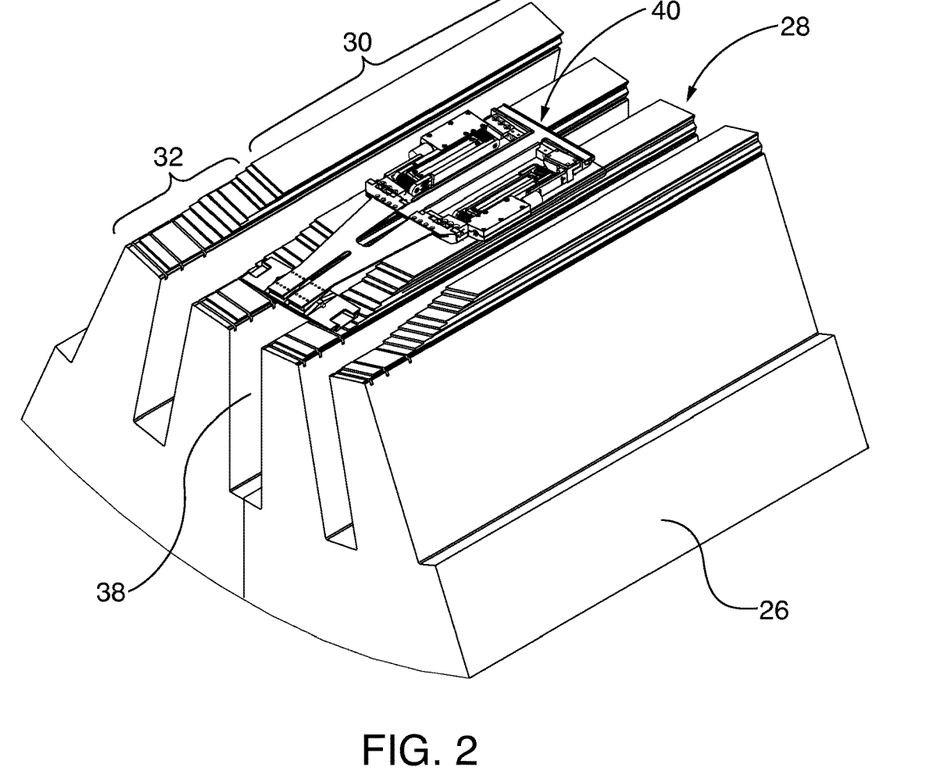
FIG. 2 is a fragmentary perspective view of a rotor core step iron region being inspected for lamina insulation defects with an inspection crawler apparatus, in accordance with exemplary embodiments of the invention.

FIG. 2 illustrates an exemplary embodiment of an EL CID inspection crawler 40 positioned on a stator core 26 of a generator. The stator core 26 has a stator core bore 28 with an axial axis that is aligned with its corresponding rotor's rotational axis, and includes a straight bore portion 30, along with a step iron portion 32 adjacent to one of the stator axial ends. The straight bore portion 30 has a generally constant diameter 30 along the axial direction, while the step iron portion 32 incorporates a stepped increase in diameter along the axial direction outboard of the adjoining straight portion 30. The stator core 26 also includes a plurality of axially extending slots 38, with the inspection device 40 being positioned along one of the slots 38. In some embodiments, the crawler 40 is securely held in the slot 38 position, for example by magnetic force, which will be described in detail herein.

Figure 3:
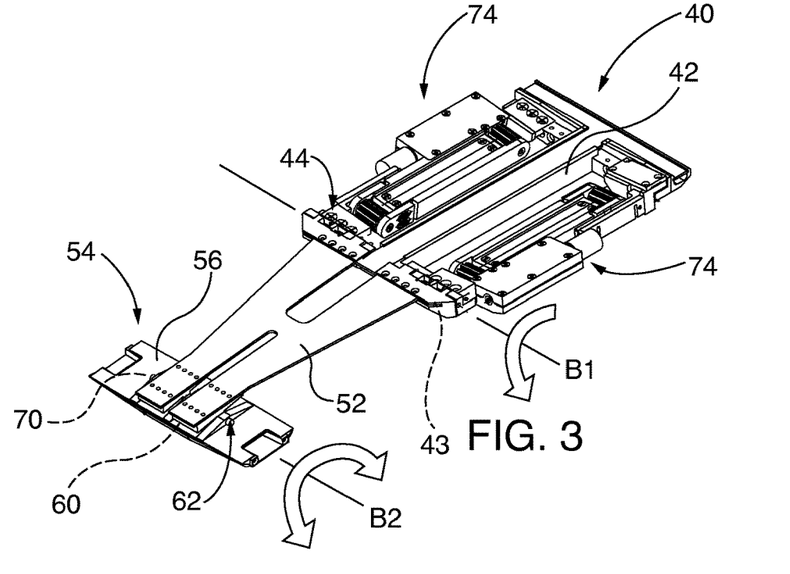
FIG. 3 is a perspective view of the inspection crawler apparatus of FIG. 2.
Figure 4:
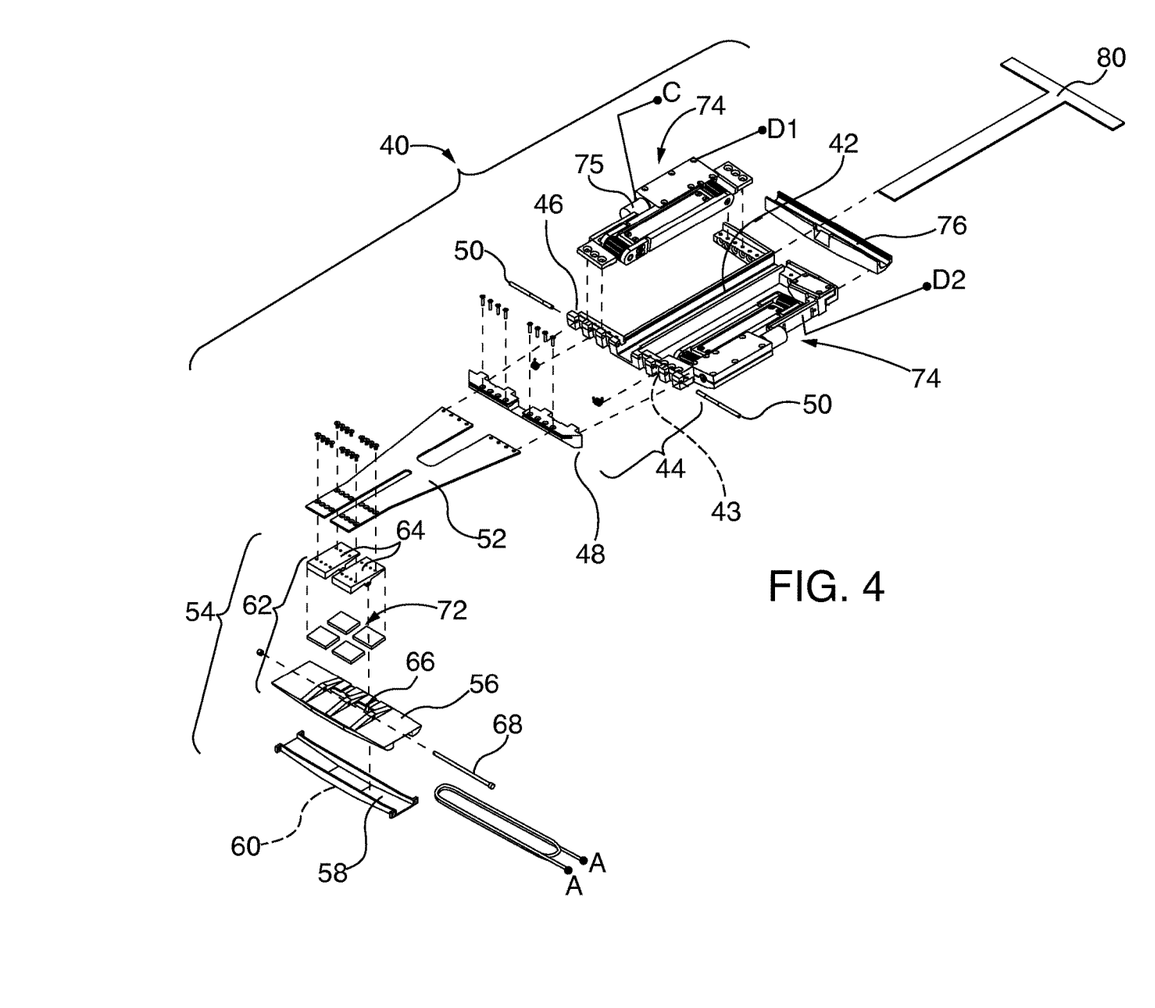
FIG. 4 an exploded view of the inspection crawler apparatus of FIGS. 2 and 3.

FIGS. 3 and 4 respectively show perspective and exploded or unassembled views of an exemplary embodiment of the inspection crawler apparatus 40. As shown in FIGS. 2-4, the inspection device 40 broadly includes a carriage or main body 42, having a central channel and a carriage bottom surface 43 for contact with the stator bore 28 inner circumference. An aft end of the carriage 42 is coupled to a first hinge assembly 44, which includes an inboard hinge portion 46 with an incorporated first biasing element, such as a torsion spring. The biasing element in the first hinge assembly 44 exerts a torsional biasing force B1 on the first hinge outboard hinge portion 48. The respective inboard and outboard hinge portions 46, 48 are coupled by first hinge pin 50. The first hinge assembly 44 pivotal axis is generally parallel with the carriage bottom surface 43. A pivoting extension arm 52 has a proximal end pivotally coupled to the first hinge assembly 44 by the first hinge outboard portion 48, so that the extension arm trails the carriage 42, as the inspection crawler apparatus 40 translates from left to right in FIG. 2 (i.e., from the outboard step iron portion 32 toward the inboard straight portion 30 of the stator core 26). In some embodiments, the extension arm 52 is constructed from sheet carbon fiber material for strength and flexibility. A distal portion of the extension arm 52 is pivotally coupled to a Chattock coil assembly 54.

Referring to the FIG. 4 exploded view, the exemplary Chattock coil assembly 54 comprises a coil housing coil holder 56 and a mating coil housing coil cover 58. A bottom surface of the housing coil cover 58 defines a sensing surface 60 that is aligned parallel to the abutting corresponding stator coil bore 28 circumferential surface profile. A coil housing pivot mount 62, which is also referred to as the second hinge assembly, includes a pair of mounting blocks 64 coupled to the distal end of the extension arm 52 and a mating coil housing hinge portion 66. The mounting blocks 64 and the mating coil housing hinge portion 66 are pivotally coupled by second hinge pin 68. The second hinge pin 68 establishes a second pivot axis, which is parallel to the sensing surface 60 and the first hinge 44 pivoting axis. Thus in the exemplary embodiment inspection crawler 40, the first pivoting axis established by the first hinge 44 and the second pivoting axis established by the coil housing pivot mount 62 are parallel to each other, as well as to the generally planar carriage bottom surface 43 and the sensing surface 60 of the coil housing coil cover 58.

While the first and second hinge axes respectively defined by the first hinge 44 and the coil housing pivot mount 62 in this exemplary embodiment have two orthogonal axes of motion, ball and socket, universal joint or other types of three orthogonal axes range of motion hinge devices can be substituted in alternative embodiments, so long as the elongated, planar sensing surface 60 of the coil housing cover 58 has sufficient radial range of motion to be aligned parallel with the stator coil bore 28 circumferential surface in the relatively steep slope of the step iron region 32 or in any other desired region. The EL CID system's Chattock coil 70 is housed in the Chattock coil assembly 54 proximate the elongated, planar sensing surface 60, within the internal volume of the coil housing coil holder 56 and its mating coil housing coil cover 58.

The exemplary embodiment Chattock coil assembly 54 coil housing pivot mount 62 incorporates compressible foam material pads 72, which are interposed between the mounting blocks 64 and the coil housing hinge portion 66 laterally flanking the second hinge pin 68. The foam pads 72 comprise a second biasing element for biasing the elongated sensing surface 60 parallel with and in abutting contact with the stator core circumferential surface 28, in either clockwise or counterclockwise directions denoted by the arrow B2 of FIG. 3. The foam pads 72 also dampen chatter vibrations induced between the elongated sensing surface 60 contact with the stator core bore circumferential surface 28, such as in the step iron region 32, when the inspection crawler 40 is inserted within a generator rotor gap 34, and as the Chattock coil assembly 54 is translated along the stator core 26 axial dimension by the inspection crawler 40.

The exemplary inspection crawler 40 incorporates a pair of motorized drives 74 to position the Chattock coil assembly 54 selectively at any desired axial position within the stator core 26 step iron region 32 or straight portion 30. The motorized drives 74 have permanent magnets embedded in their bottom surfaces, proximate the carriage bottom surface 43, which allows the drives 74 to be attracted to the stator core bore 28 circumferential surface at any circumferential angular orientation, 360 degrees around the stator core 26. The drives 74 have rubber belts so that the inspection crawler 40 can self-propel itself axially along the stator core bore 28. At least one of the drives 74 incorporates a digital encoder 75 to provide axial position information. The wire guide 76 facilitates passage of Chattock coil 70, drive system 74, and digital encoder 75 wiring to and from other EL CID inspection system components. Cover 80 shields the wire guide 76 and carriage 42 central channels. While not shown in the figures, the carriage bottom surface 43 incorporates one or more guides, which are inserted into the stator slots 38, to center the carriage 42 as it drives axially in the stator core bore 28.

Figure 5:
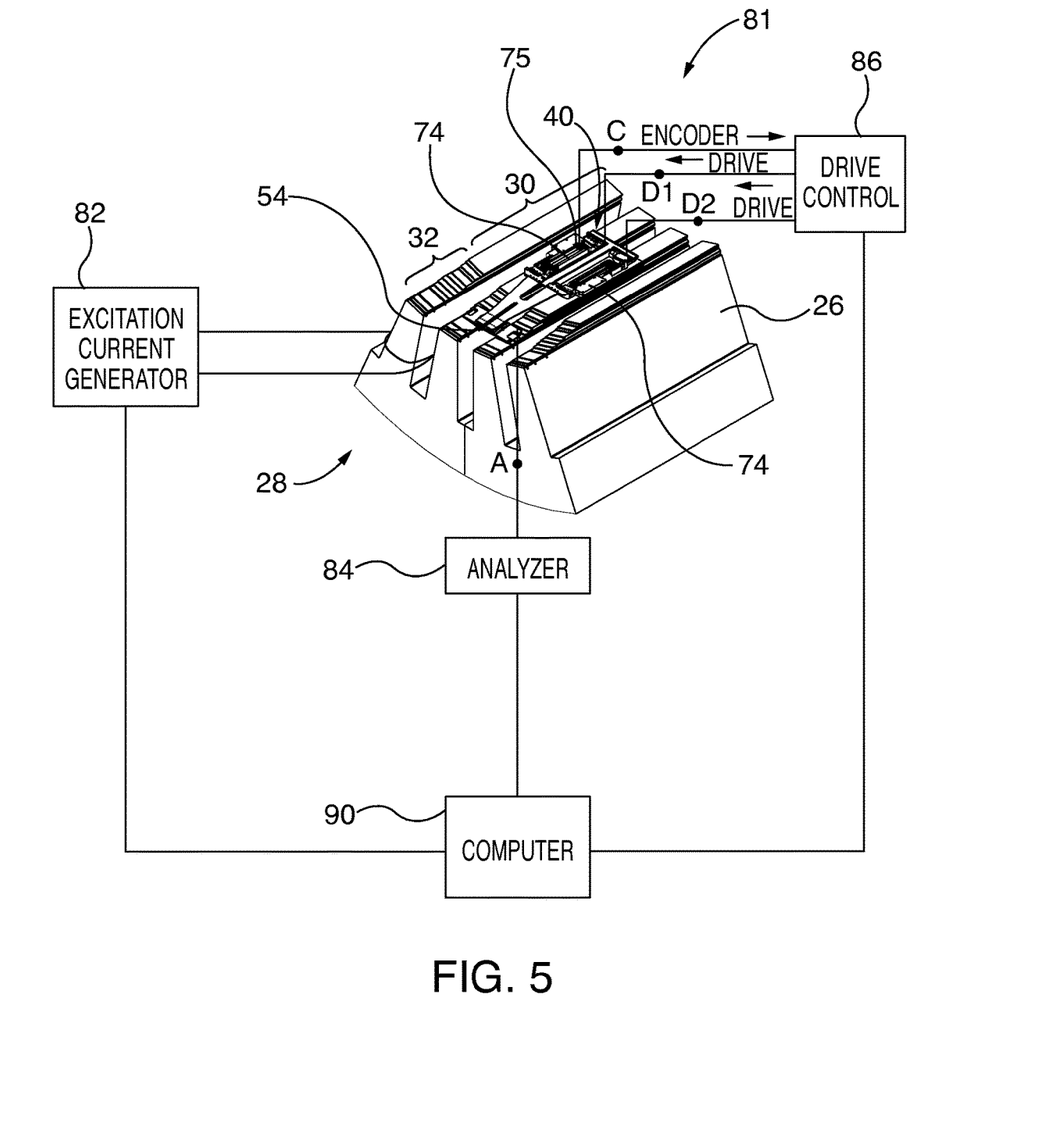
FIG. 5 is a schematic block diagram of an inspection system, including the inspection crawler apparatus of FIGS. 2 and 3, in accordance with an exemplary embodiment of the invention.

FIG. 5 is a schematic representation of the inspection system electronics of the entire inspection system 81, which include the inspection crawler 40 Chattock coil assembly 54, motorized drives 74, digital encoder 75, associated excitation current generator 82, eddy current inspection analyzer system 84, drive controller 86, and system computer 90. The Chattock coil 70 in the Chattock coil assembly 54 is coupled to the eddy current inspection analyzer system 84, which monitors the coil output signal. The inspection analyzer 84 enables manual or automated correlation of monitored coil output with eddy current generation, and associated localized lamination insulation degradation. The drive system 74 operation, to translate the inspection crawler 40 within a step iron region 32 or any other region within the stator core 26, is performed with the drive controller 86. In exemplary embodiments, the drive controller 86 uses the encoder 75 output signals to determine relative position of the inspection crawler 40 within the stator core 26. While Chattock coil assembly 54 output data and crawler apparatus 40 position can be monitored and recorded manually by a human operation, the exemplary inspection system integrates automatic data monitoring, recording and inspection crawler positioning functions though computer 90, such as a laptop or desktop computer. The computer 90 performs automated command and control functions through an internal processor and operating system, which together implement stored program instructions.

While there is reference to an exemplary controller platform architecture and implementation by software modules executed by the processor, it is also to be understood that exemplary embodiments of the invention may be implemented in various forms of hardware, software, firmware, special purpose processors, or a combination thereof. Preferably, aspects of the invention embodiments are implemented in software as a program tangibly embodied on a program storage device. The program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may be either part of the microinstruction code or part of the program (or combination thereof) which is executed via the operating system. In addition, various other peripheral devices may be connected to the computer/controller platform.

It is to be understood that, because some of the constituent system components and method steps depicted in the accompanying figures are preferably implemented in software, the actual connections between the system components (or the process steps) may differ depending upon the manner in which the exemplary embodiments are programmed. Specifically, any of the computer platforms or devices may be interconnected using any existing or later-discovered networking technology and may all be connected through a lager network system, such as a corporate network, metropolitan network or a global network, such as the Internet.

Figure 6:
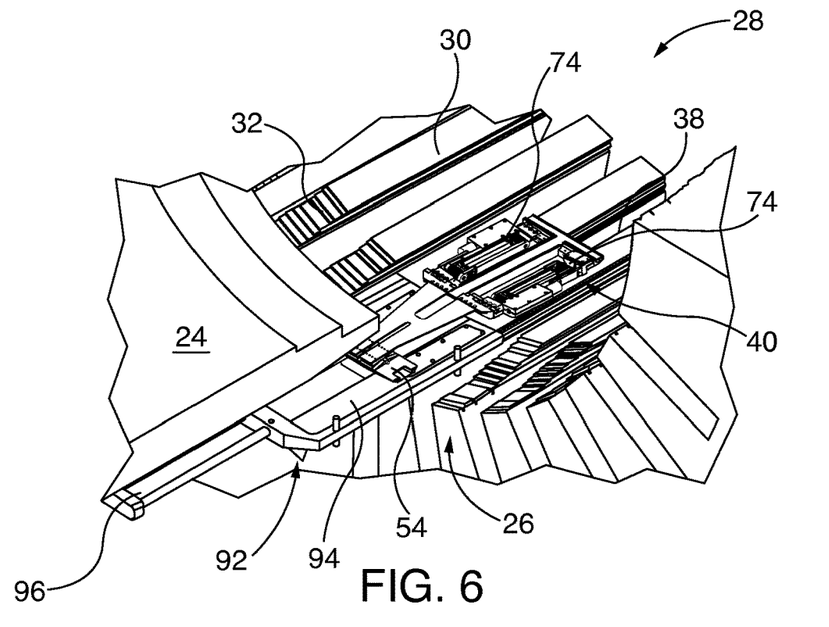
FIG. 6 is a fragmented perspective view showing the crawler apparatus of FIG. 2 being inserted into the rotor gap space between the rotor and stator core, including the core's step iron region, with an insertion tool, in accordance with an exemplary embodiment of the invention, without removing the rotor.
Figure 7:
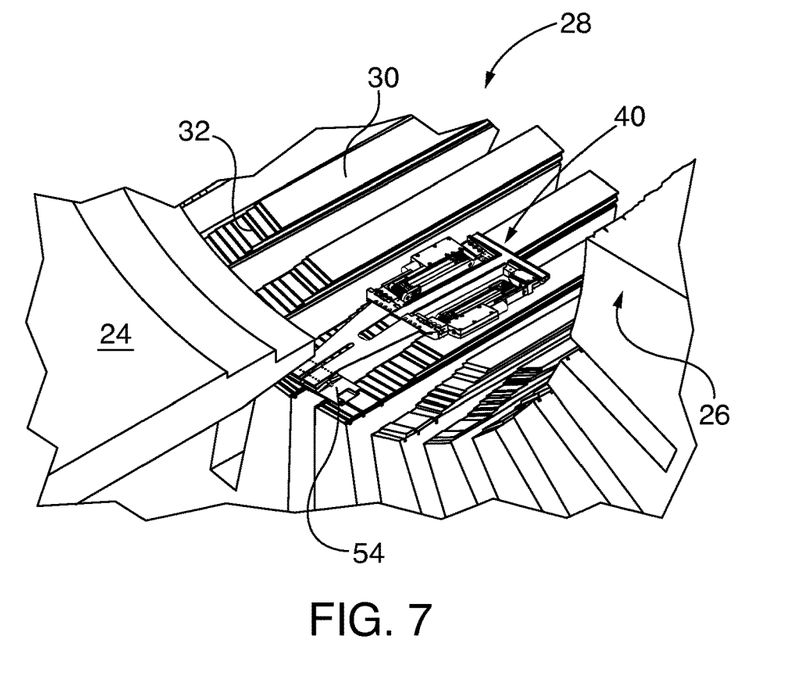
FIG. 7 is a fragmented perspective view showing the crawler apparatus of FIG. 2 after insertion into the rotor core, with the EL CID sensing coil in contact with the rotor core's step iron region, after withdrawal of the insertion tool, in accordance with an exemplary embodiment of the invention.

In operation, the inspection crawler apparatus 40 driven into the rotor gap 34 between the stator core 26 and the rotor retaining ring 24 with a paddle-like insertion tool 92, shown in FIG. 6. The insertion tool 92 has a flat, planar platform 94 and a permanently installed positioning handle 96. The planar platform 94 is placed over and aligned with the step iron 32 surface slope, which provides a stable, non-rocking, flat surface for the crawler apparatus 40 drives to gain traction and engage on the stator bore 28 circumferential surface. The insertion tool 92 allows the crawler apparatus 40 to drive on and off the stator core bore 28. FIG. 7 shows the inspection crawler 40 after it has been inserted into the stator core bore 28, with its Chattock coil assembly 54 in position in the step iron region 32. The insertion tool 92 was previously retracted from the stator gap region 34 prior to initiation of lamination inspection, until needed for subsequent withdrawal of the inspection crawler apparatus 40.

A rotor lamina insulation scanning inspection with the EL CID system is performed after the inspection crawler 40 is driven into the stator core bore 28 within the rotor gap 34 to a desired axial location. The drive system 74 magnets attract the stator core 26, which holds the inspection crawler 40 in a fixed radial position. Electrical connections are established among the inspection crawler 40 Chattock coil 70 and the eddy current analyzer 84 (see connection node A of FIGS. 4 and 5); as well as the position encoder 75 (see connection node C of FIGS. 4 and 5) and the motorized drive system 74 (see connection nodes D1 and D2 of FIGS. 4 and 5) to the drive controller 86.

An exemplary stator core lamina insulation inspection method involves energization of the stator core 26. This may include employing an excitation loop wire (usually of several turns) installed in the stator core bore 28. The excitation loop is then connected to a source of constant frequency amplitude-adjustable AC voltage and energized. Typically, in EL CID systems a chosen excitation frequency is 50 Hz-60 Hz. In some embodiments, excitation is performed at multiple frequencies within a frequency range of 50 Hz-2 MHz. The drive system 74 drive motors are activated and controlled, for example, remotely from the generator 20, to cause the Chattock coil assembly 54 and its sensing surface 60 to move axially along the stator core circumferential surface 28, at a predetermined speed, which may be constant or variable. The Chattock coil 70 is electromagnetically coupled, or is in electromagnetic communication with the energized stator core 26. As the Chattock coil 70 is maneuvered along the axial length of the stator core 26 bore surface 28, it picks up local eddy currents, in particular, fault currents due to faulty insulation in the stator laminations 36. A signal, typically of analog nature, is generated that corresponds to the magnitude of the locally measured eddy currents. A hot spot may be detected when the locally measured eddy current corresponds to a fault value. As the Chattock coil 70 in the Chattock coil assembly 54 traverses axially over the step iron portion 32, radial position of the extension arm 52 is simultaneously moved in the direction towards or away from stator core circumferential surface 28, and the first 44 and second 62 hinge assemblies change their pivot angles, in order to maintain the Chattock coil sensing surface 60 in parallel contact with the step iron 32 portion surface profile.

The Chattock coil 70 output analog signal is processed to determine whether it is indicative of an eddy current that is attributable to a lamination insulation failure. In some embodiments, an evaluation is performed by the EL CID sensing system, by plotting the locally measured Chattock coil 70 output signal versus the axial distance that the Chattock coil assembly 54 has traveled. In some embodiments, the Chattock coil assembly 54 travel distance is determined by accessing the position encoder 75 output readings with any one or more of the eddy current analyzer system 84, the drive controller 86 and/or the computer 90 that comprise the eddy current data generation and processing portions of the EL CID sensing system. The eddy current analyzer system 84, the drive controller 86, and/or the computer 90 are positioned outside of the generator 20 during the entire scanning procedure.

At the end of a single axial position scan within the step iron 32 and/or straight portion 30 of the stator core bore 28, the inspection crawler 40 optionally repositions the crawler 40 to the next or adjacent stator slot 38 (with or without the insertion tool 92), and repeat the scan procedure. Complete scanning of the step iron portion 32 on one axial end of the stator core 26; continuing with its inboard straight portion 30, and then the following step iron portion 32 on the opposite axial end of the stator core 26 can be followed by driving the inspection crawler 40 down the platform portion 94 of the insertion tool 92. Then the inspection crawler 40 is driven up the step iron portion 32 of the next adjoining stator slot 38, in zigzag fashion. As previously mentioned, the drive system 74 permanent magnets attract the inspection crawler 40 to the stator core 26 at any circumferential angular position about the stator core bore 28, so an entire internal surface of a stator core bore 28 can be scanned in a continuous zig-zag pattern, axially across all of the stator slots 38.

The invention is capable of other embodiments and of being practiced or of being carried out in various ways. In addition, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted", "connected", "supported", and "coupled" and variations thereof are used broadly and encompass direct and indirect mountings, connections, supports, and couplings. Further, "connected" and "coupled" are not restricted to physical, mechanical, or electrical connections or couplings.

What is claimed is:

1. An inspection crawler apparatus for inspecting a step iron region of a generator stator core bore, while the rotor remains in situ therein, the step iron region oriented proximate an axial end of the generator stator core, and the generator defining a rotor gap between the stator core bore and its opposed rotor along an axial dimension of the stator core bore, comprising:
   a translatable inspection carriage, having a bottom surface;
   an extension arm having a proximal end pivotally coupled to the inspection carriage by an extension arm pivot mount along a first pivot axis;
   a Chattock coil assembly, having:
   a coil housing retaining a Chattock coil,
   an elongated sensing surface defined by the coil housing, and
   a coil housing pivot mount that is pivotally coupled to a distal end of the extension arm along a second pivot axis that is parallel to the elongated sensing surface;
   so that when the inspection carriage is inserted within a generator rotor gap between a generator core bore, including a step iron region thereof, and an opposed rotor, the carriage bottom surface is in opposed orientation with the generator core, the second pivot axis is oriented tangentially to radii defined by the stator core circumferential surface, including radii defined by the core's step iron region, and the Chattock coil sensing surface remains parallel with and in abutting contact with the stator core circumferential surface defined by the core's step iron region, as the Chattock coil assembly is translated along the stator core's axial dimension by the inspection carriage.

2. The inspection apparatus of claim 1, further comprising a first biasing element coupled to the extension arm pivot mount, for biasing the arm below the carriage bottom surface, for biasing the Chattock coil assembly toward stator core circumferential surface when the inspection carriage is inserted within a generator rotor gap.

3. The inspection apparatus of claim 1, the extension arm pivot mount further comprising a first hinge and first hinge pin; and a torsion spring first biasing element integral therewith.

4. The inspection apparatus of claim 1, further comprising a second biasing element coupled to the Chattock coil assembly, for biasing the sensing surface parallel with and in abutting contact with the stator core circumferential surface and damping vibrations induced there between, when the inspection carriage is inserted within a generator rotor gap, and as the Chattock coil assembly is translated along the stator core's axial dimension by the inspection carriage.

5. The inspection apparatus of claim 1, further comprising:
   the first pivot axis oriented parallel with the chassis bottom surface; and
   the second pivot axis parallel with the first pivot axis;
   so that when the inspection carriage is inserted within a generator rotor gap between a generator core bore, including a step iron region thereof, and an opposed rotor, the carriage bottom surface is in opposed orientation with the generator core, the first and second pivot axes are oriented tangentially to radii defined by the stator core circumferential surface, including radii defined by the core's step iron region, and the Chattock coil sensing surface remains parallel with and in abutting contact with the stator core circumferential surface defined by the core's step iron region, as the Chattock coil assembly is translated along the stator core's axial dimension by the inspection carriage.

6. The inspection apparatus of claim 1, the Chattock coil assembly further comprising:
   the coil housing having a coil holder coupled to the coil housing pivot mount, and a coil cover including the elongated sensing surface;
   the coil housing pivot mount further comprising a second hinge and second hinge pin; coupled to the coil holder and the extension arm distal end; and
   compressible foam material second biasing element interposed between the coil holder and the extension arm distal end, laterally flanking the second hinge and hinge pin, for biasing the sensing surface parallel with and in abutting contact with the stator core circumferential surface and damping vibrations induced there between, when the inspection carriage is inserted within a generator rotor gap, and as the Chattock coil assembly is translated along the stator core's axial dimension by the inspection carriage.

7. The inspection apparatus of claim 1, the carriage including magnets, for magnetically attracting the carriage bottom to the generator core bore, when the inspection carriage is inserted within a generator rotor gap.

8. The inspection apparatus of claim 1, the carriage including a motorized drive system for selectively translating the carriage along the generator core bore, when the inspection carriage is inserted within a generator rotor gap.

9. The inspection apparatus of claim 1, further comprising an encoder wheel coupled to the carriage, for correlating relative translation position of the carriage and the stator core bore axial dimension.

10. An eddy current inspection system for inspecting lamina insulation within a step iron region of a generator stator core bore, while the rotor remains in situ therein, the step iron region oriented proximate an axial end of the generator stator core, and the generator defining a rotor gap between the stator core bore and its opposed rotor along an axial dimension of the stator core bore, comprising:
   an inspection crawler, for insertion within a generator rotor gap between a generator core bore, including a step iron region thereof, and an opposed rotor, including:
   a translatable inspection carriage, having a bottom surface;
   an extension arm having a proximal end pivotally coupled to the inspection carriage by an extension arm pivot mount along a first pivot axis;
   a Chattock coil assembly, having:
   a coil housing retaining a Chattock coil,
   an elongated sensing surface defined by the coil housing, and
   a coil housing pivot mount that is pivotally coupled to a distal end of the extension arm along a second pivot axis that is parallel to the elongated sensing surface;
   an eddy current excitation generator, for coupling to a generator stator core bore and generating an excitation current therein; and an eddy current inspection analyzer system, coupled to the Chattock coil, for correlating changes in coil output signal with variations in lamina insulation properties;

so that when the eddy current excitation generator is coupled to and generating excitation current within a generator core bore and the inspection carriage is inserted within a generator rotor gap between that generator core bore, including a step iron region thereof, and its opposed rotor:

the carriage bottom surface is in opposed orientation with the generator core;

the second pivot axis is oriented tangentially to radii defined by the stator core circumferential surface, including radii defined by the core's step iron region, so that the Chattock coil sensing surface remains parallel with and in abutting contact with the stator core circumferential surface defined by the core's step iron region, as the Chattock coil assembly is translated along the step iron region's axial dimension by the inspection carriage; and the eddy current inspection analyzer system monitors changes in the Chattock coil output that are in turn correlated with variations in lamina insulation properties within the step region.

11. The inspection system of claim 10, the inspection crawler further comprising:

magnets, for magnetically attracting the carriage bottom to the generator core bore, when the inspection carriage is inserted within a generator rotor gap;

a motorized drive system for selectively translating the carriage along the generator core bore, when the inspection carriage is inserted within a generator rotor gap; and an encoder wheel coupled to the carriage and generating an encoder output signal;

the eddy current analyzer system coupled to the encoder wheel and correlating the encoder output signal with relative translation position of the carriage and the stator core bore axial dimension; and the eddy current analyzer system identifying localized variations in lamina insulation in the stator core step region.

12. The inspection system of claim 10, further comprising a first biasing element coupled to the extension arm pivot mount, for biasing the arm below the carriage bottom surface, for biasing the Chattock coil assembly toward stator core circumferential surface when the inspection carriage is inserted within a generator rotor gap.

13. The inspection system of claim 10, further comprising a second biasing element coupled to the Chattock coil assembly, for biasing the sensing surface parallel with and in abutting contact with the stator core circumferential surface and damping vibrations induced there between, when the inspection carriage is inserted within a generator rotor gap, and as the Chattock coil assembly is translated along the stator core's axial dimension by the inspection carriage.

14. The inspection system of claim 10, the Chattock coil assembly further comprising:

the coil housing having a coil holder coupled to the coil housing pivot mount, and a coil cover including the elongated sensing surface;

the coil housing pivot mount further comprising a second hinge and second hinge pin; coupled to the coil holder and the extension arm distal end; and compressible foam material second biasing element interposed between the coil holder and the extension arm distal end, laterally flanking the second hinge and hinge pin, for biasing the sensing surface parallel with and in abutting contact with the stator core circumferential surface and damping vibrations induced there between, when the inspection carriage is inserted within a generator rotor gap, and as the Chattock coil assembly is translated along the stator core's axial dimension by the inspection carriage.

15. A method for inspecting lamina insulation within a step iron region of a generator stator core bore, while the rotor remains in situ therein, the step iron region oriented proximate an axial end of the generator core, and the generator defining a rotor gap between the stator core bore and its opposed rotor along an axial dimension of the stator core bore, comprising:

providing a generator having an in situ rotor circumscribed by a stator core bore, and a step iron region oriented proximate an axial end of the generator stator core, the generator defining a rotor gap between the stator core bore and its opposed rotor along an axial dimension of the stator core bore;

providing an eddy current inspection system, including:
inspection crawler, having:
a translatable inspection carriage, having a bottom surface;
an extension arm having a proximal end pivotally coupled to the inspection carriage by an extension arm pivot mount along a first pivot axis;
a Chattock coil assembly, having:
a coil housing retaining a Chattock coil,
an elongated sensing surface defined by the coil housing, and
a coil housing pivot mount that is pivotally coupled to a distal end of the extension arm along a second pivot axis that is parallel to the elongated sensing surface;
an eddy current excitation generator, for coupling to a generator stator core bore and generating an excitation current therein; and
an eddy current inspection analyzer system, coupled to the Chattock coil, for correlating changes in coil output signal with variations in lamina insulation properties;

inserting the inspection carriage within the generator rotor gap so that the carriage bottom surface is in opposed orientation with the generator core circumferential surface;

translating the carriage along the stator core axial dimension, so that the Chattock coil sensing surface is parallel with and in opposed abutting contact with the stator core circumferential surface defined by the core's step iron region;

coupling the eddy current excitation generator to a generator stator core bore, and generating an excitation current therein, before or after the inspection carriage insertion;

coupling the eddy current inspection analyzer system to the Chattock coil, before or after inspection carriage insertion; for receiving an output signal therefrom and correlating the output signal with lamina insulation properties; and translating the Chattock coil sensing surface along the step iron region by translating the carriage along the stator core and monitoring changes in the Chattock coil output signal with the eddy current inspection analyzer system.

16. The method of claim 15, further comprising correlating changes in the Chattock coil output with variations in lamina insulation properties within the step region, with the eddy current inspection analyzer system.

17. The method of claim 15, further comprising inserting the inspection carriage within the generator rotor gap between the in situ rotor retaining ring and the stator core step iron region by inserting a ramp in abutting relationship with the step iron region and translating the carriage up the ramp.

18. The method of claim 15, further comprising:
the provided inspection crawler further having:
magnets, for magnetically attracting the carriage bottom to the generator core bore, when the inspection carriage is inserted within the generator rotor gap;
a motorized drive system for selectively translating the carriage along the generator core bore, when the inspection carriage is inserted within the generator rotor gap; and
an encoder wheel coupled to the carriage and generating an encoder output signal;
coupling the eddy current analyzer system to the encoder wheel and correlating the encoder output signal with relative translation position of the carriage and the stator core bore axial dimension; and
translating the carriage along the generator core bore, the eddy current analyzer system identifying localized variations in lamina insulation in the stator core step region along the stator core bore axial dimension.

19. The method of claim 15, further comprising inserting the carriage into the rotor gap with the extension arm trailing the carriage, with an insertion tool.

20. The method of claim 15, further comprising translating the Chattock coil sensing surface inboard of the step iron region by translating the carriage along the stator core and monitoring changes in the Chattock coil output signal with the eddy current inspection analyzer system.

* * * * *